United States Patent
Kono (10) Patent No.: US 8,174,679 B2
(45) Date of Patent: May 8, 2012

(54) ILLUMINATION OPTICAL SYSTEM, EXPOSURE APPARATUS, AND DEVICE FABRICATION METHOD

(75) Inventor: Michio Kono, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 504 days.

(21) Appl. No.: 12/390,351

(22) Filed: Feb. 20, 2009

(65) Prior Publication Data

US 2009/0219498 A1 Sep. 3, 2009

(30) Foreign Application Priority Data

Feb. 28, 2008 (JP) .................................. 2008-048825

(51) Int. Cl.
G03B 27/52 (2006.01)
(52) U.S. Cl. .............................. 355/70; 355/46; 355/67
(58) Field of Classification Search .................... 355/46, 355/67, 70
See application file for complete search history.

(56) References Cited

U.S. PATENT DOCUMENTS

| | | | |
|---|---|---|---|
| 4,682,885 A | 7/1987 | Torigoe | |
| 5,815,248 A * | 9/1998 | Nishi et al. | 355/71 |
| 5,880,817 A * | 3/1999 | Hashimoto | 355/53 |
| 5,991,009 A * | 11/1999 | Nishi et al. | 355/70 |
| 6,466,382 B2 * | 10/2002 | Muller-Rissmann et al. | 359/820 |
| 6,488,379 B2 * | 12/2002 | Kane | 353/94 |
| 6,727,982 B2 * | 4/2004 | Kawashima et al. | 355/70 |
| 7,161,661 B2 * | 1/2007 | Bleeker | 355/69 |
| 7,329,886 B2 * | 2/2008 | Singer et al. | 250/493.1 |
| 2003/0219094 A1 * | 11/2003 | Basting et al. | 378/34 |
| 2004/0256575 A1 * | 12/2004 | Singer et al. | 250/492.2 |
| 2006/0091327 A1 * | 5/2006 | Kroon | 250/504 R |
| 2009/0219498 A1 * | 9/2009 | Kono | 355/67 |
| 2010/0183984 A1 * | 7/2010 | Choi | 430/319 |

FOREIGN PATENT DOCUMENTS

| JP | 60-232552 A | 11/1985 |
|---|---|---|
| JP | H09-260260 A | 10/1997 |
| JP | 2007-287719 A | 11/2007 |

* cited by examiner

*Primary Examiner* — Thomas R Artman
(74) *Attorney, Agent, or Firm* — Canon USA Inc IP Division (57) ABSTRACT

The present invention provides an illumination optical system which illuminates a surface to be illuminated with light from a light source, the illumination optical system including a plurality of illumination systems configured to form predetermined illumination regions with the light from the light source, an optical system having reflecting surfaces, which are configured to reflect the light beams from the illumination systems, respectively for the plurality of illumination systems, and a light-shielding unit configured to shield a certain light component in a composite illumination region formed by the light from the optical system to shape a shape of the composite illumination region, wherein one continuous composite illumination region is formed on the surface to be illuminated by connecting the respective illumination regions by reflecting the light beams from the plurality of illumination systems by the reflecting surfaces.

10 Claims, 12 Drawing Sheets

ILLUMINATION OPTICAL SYSTEM, EXPOSURE APPARATUS, AND DEVICE FABRICATION METHOD

BACKGROUND OF THE INVENTION

1. Field of the Invention

The present invention relates to an illumination optical system, an exposure apparatus, and a device fabrication method.

2. Description of the Related Art

A projection exposure apparatus has conventionally been employed to fabricate devices such as a semiconductor device and liquid crystal panel by using photolithography. The projection exposure apparatus includes an illumination optical system for illuminating a reticle (mask) on which a circuit pattern is formed, and a projection optical system for projecting the pattern of the reticle onto a substrate such as a wafer, and transfers the pattern of the reticle onto the substrate.

Optical systems such as an illumination optical system and projection optical system generally have a feature that points spaced apart equidistantly from the optical axis of the optical system, that is, points at the same image height exhibit the same optical characteristics from the viewpoint of design. Japanese Patent Laid-Open No. 60-232552 proposes an exposure apparatus including a projection optical system in which that feature is applied to two concentric mirror systems (a concave mirror and convex mirror), and which projects the pattern of a reticle onto a wafer using an off-axis annular imaging region (effective image region).

Figure 18A:
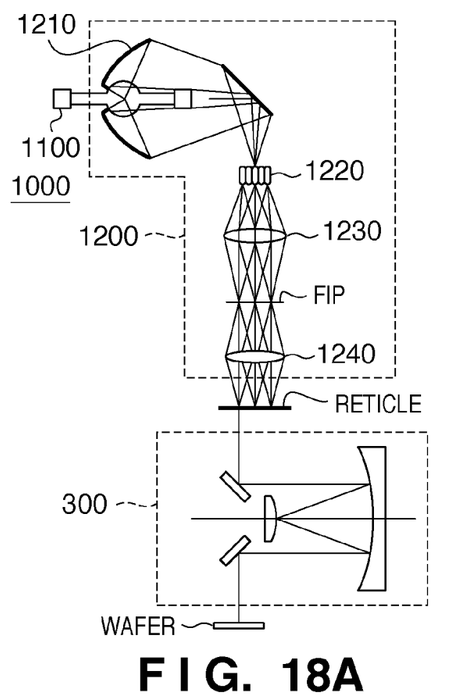
FIGS. 18A to 18F are views for explaining a conventional exposure apparatus.
Figure 18B:
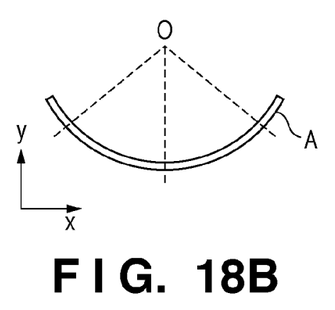

FIGS. 18A to 18F are views for explaining a conventional exposure apparatus 1000 disclosed in Japanese Patent Laid-Open No. 60-232552. The imaging region of a projection optical system 1300 in the exposure apparatus 1000 is an arcuated region A formed to have a predetermined radius using an optical axis O as the center, as shown in FIG. 18B. An illumination optical system 1200 needs to illuminate the imaging region of the projection optical system 1300 with a high illuminance.

In the illumination optical system 1200, an elliptic mirror 1210 converges a light beam emitted by a mercury lamp 1100 at a focal point. An optical integrator 1220 set near the focal point uniformly illuminates (Kohler-illuminates) the backside focal plane of a first condenser lens 1230 as a first surface to be illuminated FIP. The light beam having propagated through the first surface to be illuminated FIP illuminates a reticle via a second condenser lens 1240.

Figure 18C:
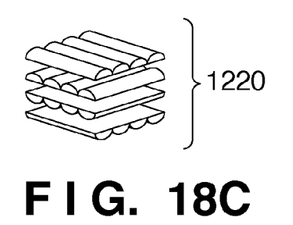
Figure 18D:
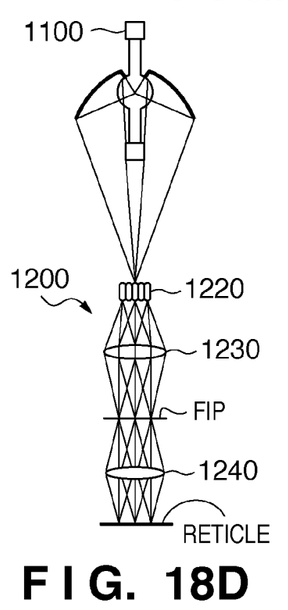
Figure 18E:
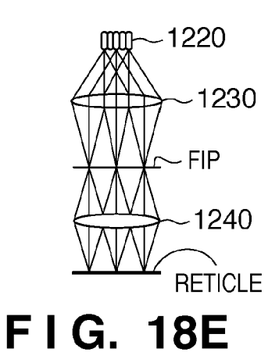
Figure 18F:
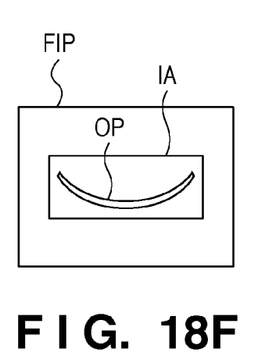

Note that the optical integrator 1220 includes a cylindrical lens array having an optical refractive power, as shown in FIG. 18C. The optical refractive power differs between two orthogonal directions, as shown in FIGS. 18D and 18E. For this reason, a rectangular illumination region IA is formed on the first surface to be illuminated FIP, as shown in FIG. 18F. Because a slit having an arcuated opening OP is set immediately beneath the first surface to be illuminated FIP, the light beam having passed through the opening OP of the slit forms an arcuated illumination region on the reticle via the second condenser lens 1240. With this arrangement, the illumination optical system 1200 can illuminate only the imaging region (arcuated region) of the projection optical system 1300.

Unfortunately, because the conventional exposure apparatus uses an arcuated illumination region extracted from a rectangular illumination region, as shown in FIG. 18F, the illumination efficiency decreases in proportion to the area ratio between the rectangular illumination region and the arcuated illumination region. This results in a decrease in the integrated illuminance (exposure amount) in exposure, leading to a decrease in the throughput (the number of wafers processed per unit time) serving as one important parameter in the exposure apparatus.

SUMMARY OF THE INVENTION

The present invention provides an illumination optical system which can form an illumination region having a uniform illuminance (for example, an arcuated illumination region) while suppressing a decrease in the illumination efficiency.

According to the first aspect of the present invention, there is provided an illumination optical system which illuminates a surface to be illuminated with light from a light source, the illumination optical system comprising a plurality of illumination systems configured to form predetermined illumination regions with the light from the light source, an optical system having reflecting surfaces, which are configured to reflect the light beams from the illumination systems, respectively for the plurality of illumination systems, and a light-shielding unit configured to shield a certain light component in a composite illumination region formed by the light from the optical system to shape a shape of the composite illumination region, wherein one continuous composite illumination region is formed on the surface to be illuminated by connecting the respective illumination regions by reflecting the light beams from the plurality of illumination systems by the reflecting surfaces.

According to the second aspect of the present invention, there is provided a scanning exposure apparatus which transfers a pattern of a reticle onto a substrate while scanning the reticle and the substrate, the apparatus comprising the above illumination optical system, which is configured to illuminate the reticle set on a surface to be illuminated with light from a light source, and a projection optical system configured to project an image of the pattern of the reticle onto the substrate.

According to the third aspect of the present invention, there is provided a device fabrication method comprising the steps of exposing a substrate using an exposure apparatus, and developing the exposed substrate, wherein the exposure apparatus includes an illumination optical system configured to illuminate the reticle set on a surface to be illuminated with light from a light source, and a projection optical system configured to project an image of the pattern of the reticle onto the substrate, wherein the illumination optical system includes a plurality of illumination systems configured to form predetermined illumination regions with the light from the light source, an optical system having reflecting surfaces, which are configured to reflect the light beams from the illumination systems, respectively for the plurality of illumination systems, and a light-shielding unit configured to shield a certain light component in a composite illumination region formed by the light from the optical system to shape a shape of the composite illumination region, wherein one continuous composite illumination region is formed on the surface to be illuminated by connecting the respective illumination regions by reflecting the light beams from the plurality of illumination systems by the reflecting surfaces.

Further features of the present invention will become apparent from the following description of exemplary embodiments with reference to the attached drawings.

DESCRIPTION OF THE EMBODIMENTS

Preferred embodiments of the present invention will be described below with reference to the accompanying drawings. The same reference numerals denote the same members throughout the drawings, and a repetitive description thereof will not be given.

Figure 1:
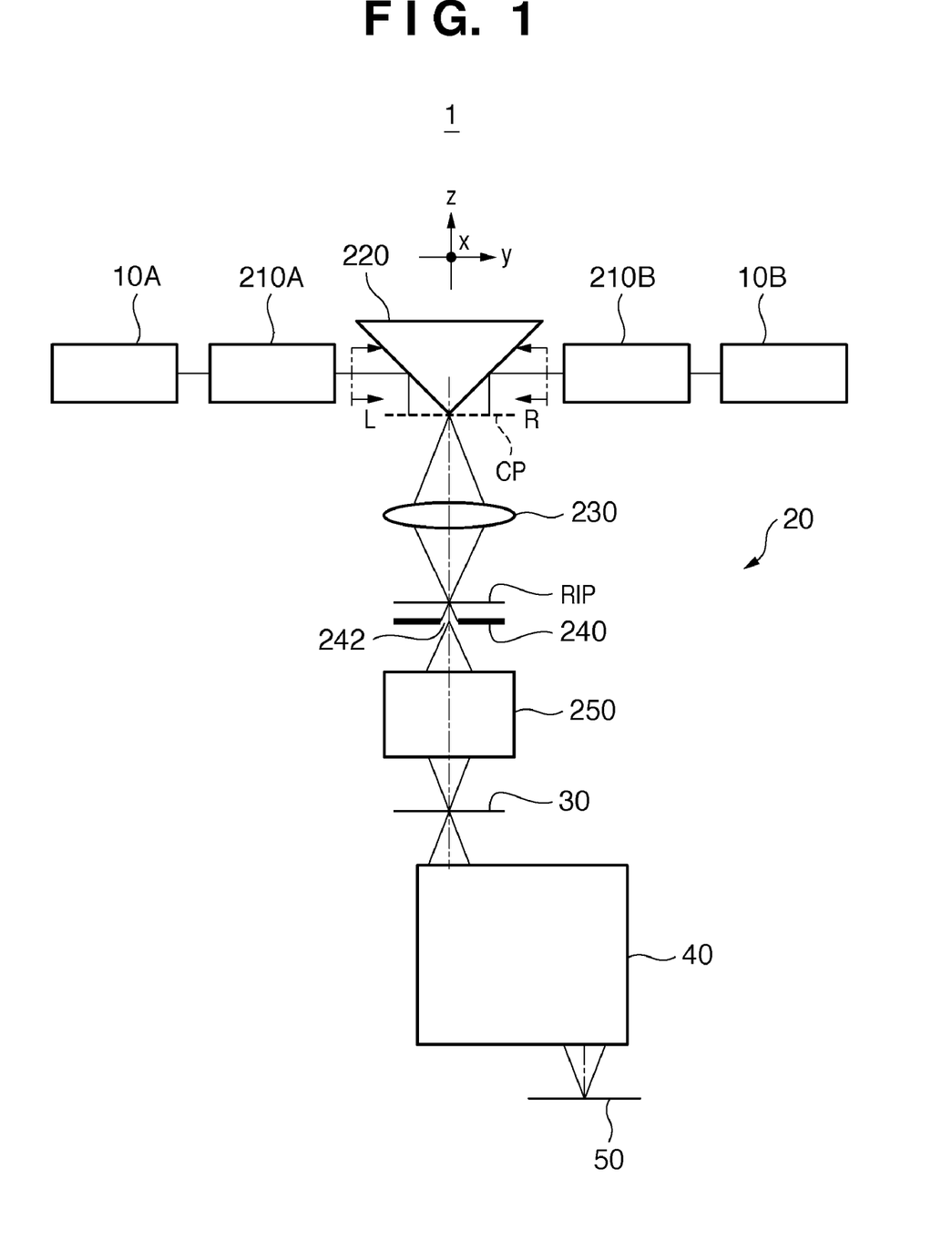
FIG. 1 is a schematic view showing the arrangement of an exposure apparatus according to one aspect of the present invention.

FIG. 1 is a schematic view showing the arrangement of an exposure apparatus 1 according to one aspect of the present invention. The exposure apparatus 1 is a scanning projection exposure apparatus (scanner) which transfers the pattern of a reticle 30 onto a wafer 50 by the step & scan scheme.

The exposure apparatus 1 includes light sources 11A and 10B, an illumination optical system 20, a reticle stage (not shown) for mounting the reticle 30, a projection optical system 40, and a wafer stage (not shown) for mounting the wafer 50. Note that the light sources 11A and 10B may be provided separately.

Each of the light sources 11A and 10B is an excimer laser such as an ArF excimer laser having a wavelength of about 193 nm or a KrF excimer laser having a wavelength of about 248 nm. However, each of the light sources 11A and 10B is not particularly limited to an excimer laser, and may be an $F_2$ laser having a wavelength of about 157 nm or a lamp such as a mercury lamp or xenon lamp.

The illumination optical system 20 illuminates the reticle 30 with light beams from the light sources 11A and 10B, and forms a uniform illumination region (illuminance distribution) on a predetermined surface to be illuminated (for example, the reticle surface) in this embodiment. The illumination optical system 20 includes a plurality of illumination systems 210A and 210B, an optical member 220, a condenser system 230, a light-shielding unit 240, and an imaging optical system 250.

In the illumination optical system 20, a light beam (illumination light beam) emitted by the light source 11A forms a uniform illumination region via the illumination system 210A. The illumination system 210A can take any form known to those skilled in the art. The illumination system 210A includes, for example, an elliptic mirror for converging a light beam from the light source 10A, optical integrator, and condenser lens, and has an optical arrangement to obtain a rectangular uniform illumination region. Likewise, a light beam (illumination light beam) emitted by the light source 10B forms a rectangular uniform illumination region via the illumination system 210B.

The light beams from the illumination systems 210A and 210B converge on an illumination region compositing plane CP upon being reflected by the optical member 220 set immediately before surfaces to be illuminated by the illumination systems 210A and 210B. The illumination region compositing plane CP is optically equivalent to the surfaces to be illuminated by the illumination systems 210A and 210B when the optical member 220 is not set on the optical path of the illumination optical system 20. The arrangement and action of the optical member 220 will be described in detail later.

The light having propagated through the illumination region compositing plane CP diffuses and enters the condenser system 230, and converges on a re-imaging plane RIP by the converging action of the condenser system 230. In this embodiment, a light-shielding unit 240 having an arcuated opening 242 is set near the re-imaging plane RIP. The light-shielding unit 240 is set at a position optically conjugate to the reticle 30 (in this embodiment, between the optical member 220 and the reticle 30). The light-shielding unit 240 shields a certain light component in a composite illumination region CIA formed by the optical member 220 (to be described later) to adjust the shape of the composite illumination region CIA.

The light having passed through (the opening 242 of) the light-shielding unit 240 diffuses and enters the imaging optical system 250, and forms an image on the reticle 30 by the converging action of the imaging optical system 250.

Figure 2:
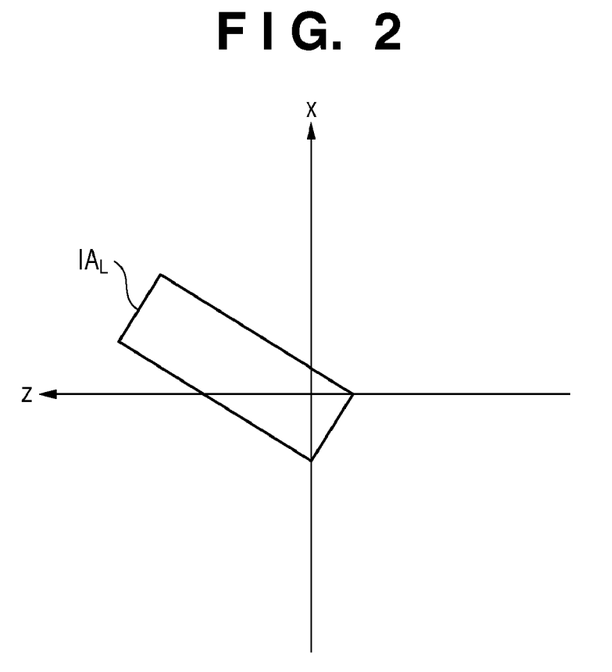
FIG. 2 is a diagram showing a rectangular illumination region (along the x-z section) formed by an illumination system in an illumination optical system of the exposure apparatus shown in FIG. 1.
Figure 3:
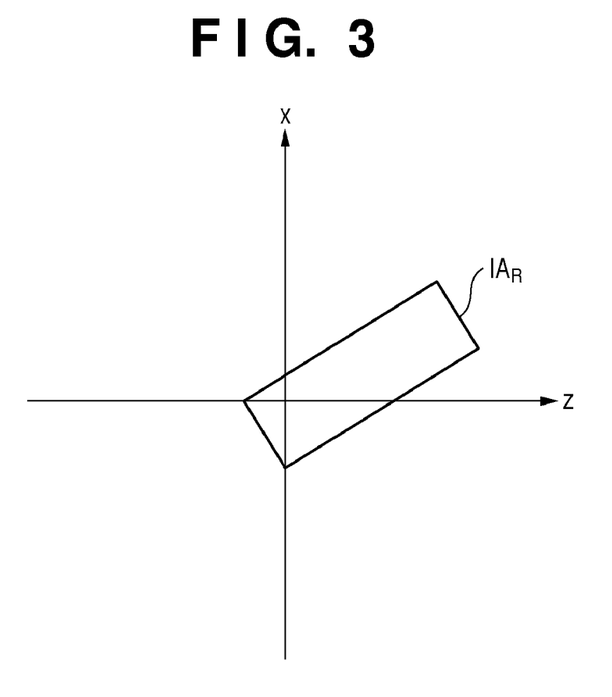
FIG. 3 is a diagram showing a rectangular illumination region (along the x-z section) formed by an illumination system in the illumination optical system of the exposure apparatus shown in FIG. 1.
Figure 4:
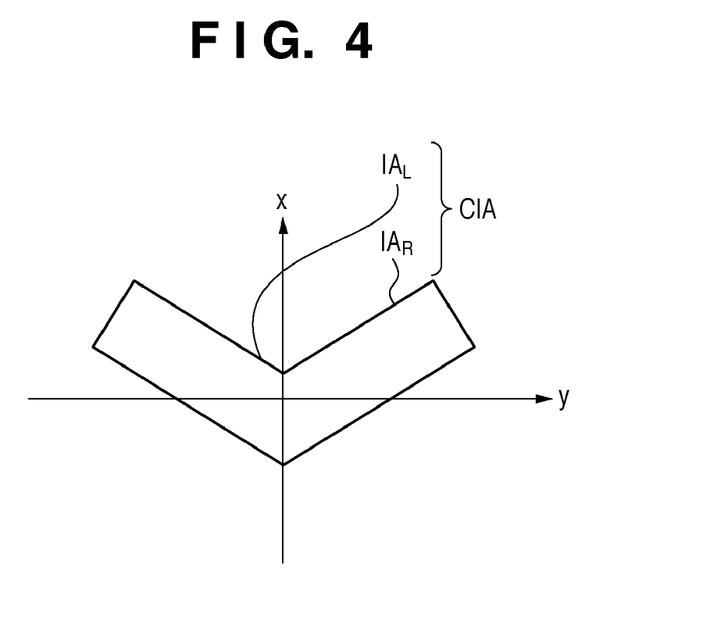
FIG. 4 is a diagram showing a V-shaped composite illumination region formed by an optical member in the illumination optical system of the exposure apparatus shown in FIG. 1.

Illumination regions formed by the illumination optical system 20 will be explained herein. FIG. 2 is a diagram showing a rectangular illumination region $IA_L$ (along the x-z section) formed by the illumination system 210A. FIG. 3 is a rectangular illumination region $IA_R$ (along the x-z section) formed by the illumination system 210B. Note that FIGS. 2 and 3 show illumination regions $IA_L$ and $IA_R$ formed when the optical member 220 is not set on the optical path of the illumination optical system 20. The illumination regions $IA_L$ and $IA_R$ shown in FIGS. 2 and 3 are composited (connected) by the optical member 220 to form a V-shaped composite illumination region CIA, as shown in FIG. 4, on the illumination region compositing plane CP. FIG. 4 is a diagram showing the V-shaped composite illumination region CIA formed by the optical member 220.

Figure 5:
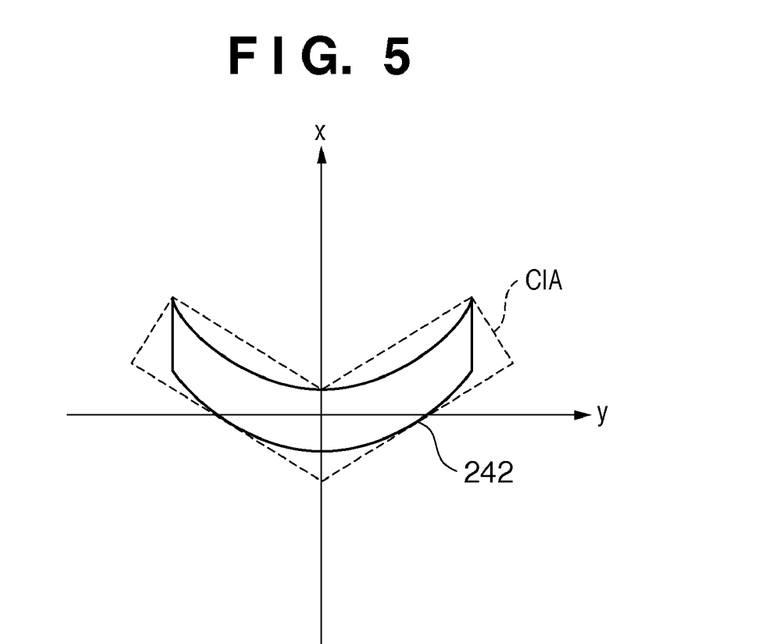
FIG. 5 is a diagram showing the relationship between the composite illumination region shown in FIG. 4 and a light-shielding unit (opening).
Figure 6:
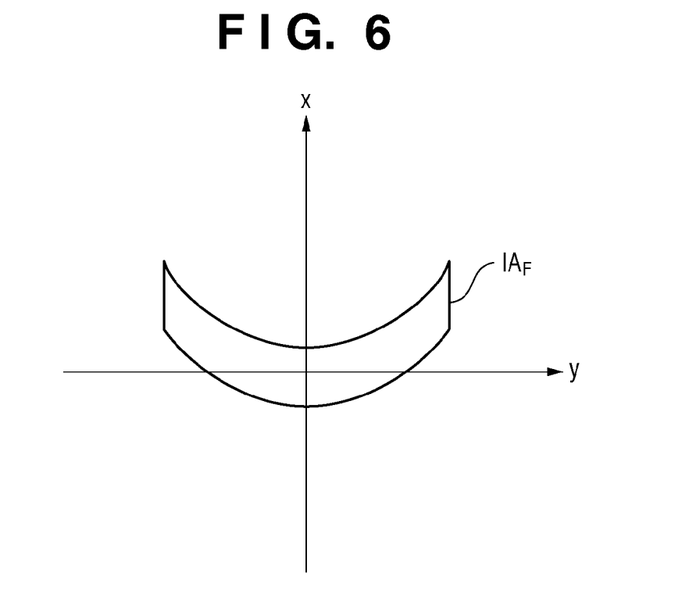
FIG. 6 is a diagram showing an arcuated illumination region formed on a reticle by the illumination optical system of the exposure apparatus shown in FIG. 1.

The V-shaped composite illumination region CIA formed on the illumination region compositing plane CP is reproduced (formed) on the re-imaging plane RIP as well via the condenser system 230, but is partially extracted by (the opening 242 of) the light-shielding unit 240, as shown in FIG. 5. For this reason, an arcuated illumination region $IA_F$ corresponding to the opening 242 of the light-shielding unit 240 is formed on the reticle 30 via the imaging optical system 250, as shown in FIG. 6. FIG. 5 is a diagram showing the relationship between the composite illumination region CIA and the light-shielding unit 240 (opening 242). FIG. 6 is a diagram showing the illumination region $IA_F$ formed on the reticle 30 by the illumination optical system 20.

In this manner, the illumination optical system 20 according to this embodiment uses the arcuated illumination region $IA_F$ extracted from the V-shaped composite illumination region CIA. This makes it possible to dramatically improve the illumination efficiency as compared with the prior art (see FIG. 18) which extracts an arcuated illumination region from a rectangular illumination region. The illumination optical system 20 (the illumination systems 210A and 210B and the optical member 220) preferably forms a V-shaped composite illumination region CIA so that the arcuated opening 242 of the light-shielding unit 240 is inscribed in the composite illumination region CIA. This makes it possible to minimize a region of the composite illumination region CIA, which is shielded against light by the light-shielding unit 240, thus further improving the illumination efficiency.

The optical member 220 will be explained in detail next. The optical member 220 forms a V-shaped illumination region $IA_F$ by accurately connecting (compositing) the rectangular illumination regions $IA_L$ and $IA_R$ formed by the illumination systems 210A and 210B, respectively, as mentioned above.

The optical member 220 has a plurality of reflecting surfaces which reflect the light beams from a plurality of illumination systems, and is set such that the plurality of reflecting surfaces form one continuous composite illumination region CIA on the surfaces to be illuminated by the light beams from the plurality of illumination systems.

Figure 7:
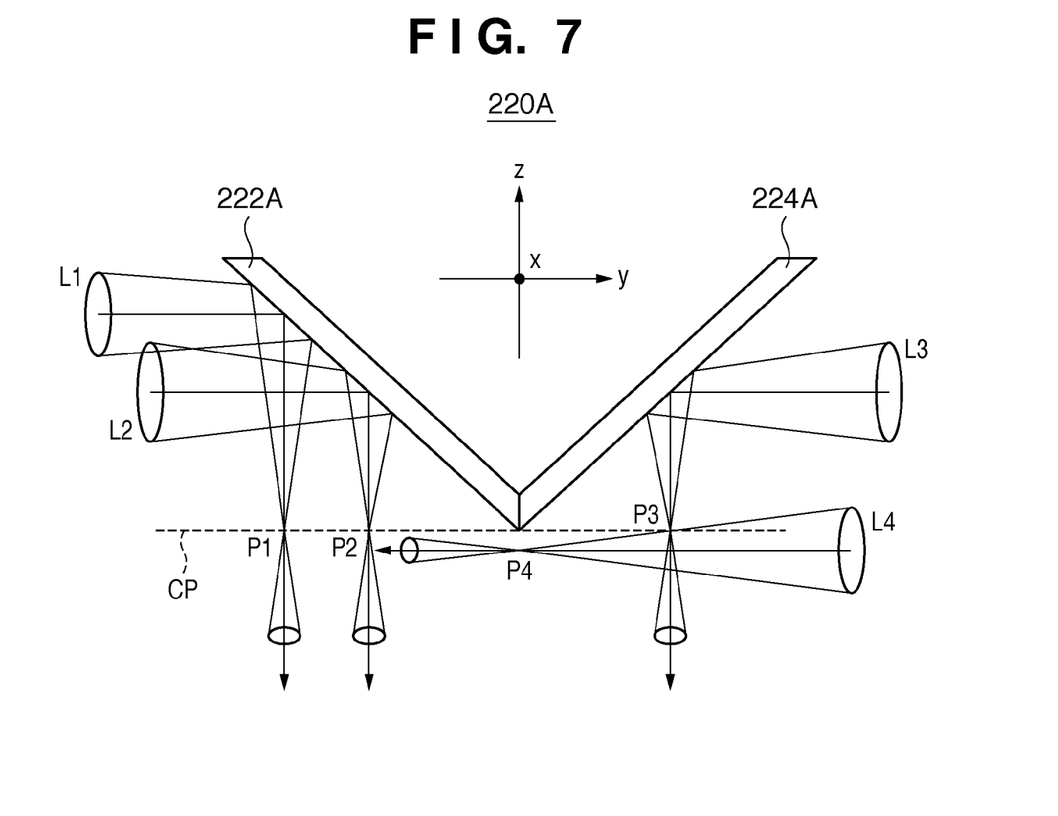
FIG. 7 is a view showing a Dach mirror as an example of the optical member in the illumination optical system of the exposure apparatus shown in FIG. 1.

More specifically, a Dach mirror 220A configured such that mirrors 222A and 224A which reflect the light beams from the illumination systems 210A and 210B, respectively, are orthogonal (perpendicular) to each other, as shown in FIG. 7, is used as the optical member 220. The Dach mirror 220A is an optical element configured such that its adjacent reflecting surfaces (in this embodiment, the mirrors 222A and 224A) are orthogonal to each other. FIG. 7 is a view showing the Dach mirror 220A serving as an example of the optical member 220.

Referring to FIG. 7, as converging light components L1 and L2 enter the Dach mirror 220A from the illumination system 210A, they converge at focal points P1 and P2 upon being reflected by the mirror 222A. Likewise, as a converging light component L3 enters the Dach mirror 220A from the illumination system 210B, it converges at a focal point P3 upon being reflected by the mirror 224A. Hence, the converging light components L1 to L3 travel in the optical axis direction of the illumination optical system 20 (z direction) via the Dach mirror 220A and contribute as the illumination light.

A converging light component L4 which enters a region other than the effective region of the mirror 224A converges at a focal point P4. Note that the converging light component L4 does not enter the mirror 224A, so it travels in the y direction in which converging light is not guided to contribute as the illumination light, without traveling in the z direction in which converging light is guided to contribute as the illumination light.

Figure 8:
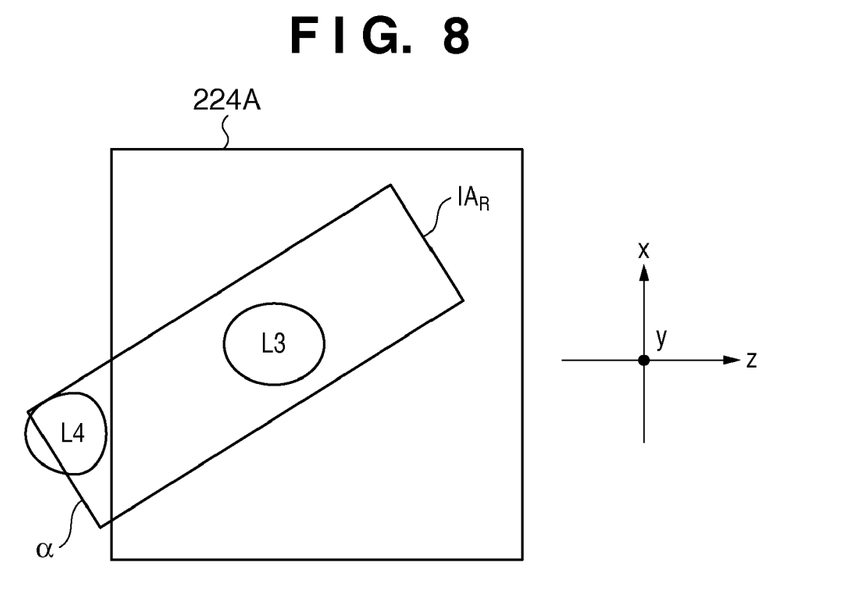
FIG. 8 is a diagram showing the relationship between the Dach mirror shown in FIG. 7 and an illumination region formed by the illumination system.

FIG. 8 is a diagram showing the relationship between the mirror 224A of the Dach mirror 220A and the illumination region $IA_R$ formed by the illumination system 210B. Referring to FIG. 8, because the light beam from the illumination system 210B enters the Dach mirror 220A, a rectangular illumination region $IA_R$ tilted with respect to the mirror 224A is formed by the mirror 224A. Note that a light component in a region $\alpha$, which is not reflected by the mirror 224A (Dach mirror 220A), such as the converging light component L4 is not guided to the illumination region compositing plane CP. In other words, the rectangular illumination region $IA_R$ is shaped into a trapezoidal illumination region by the Dach mirror 220A.

Figure 9:
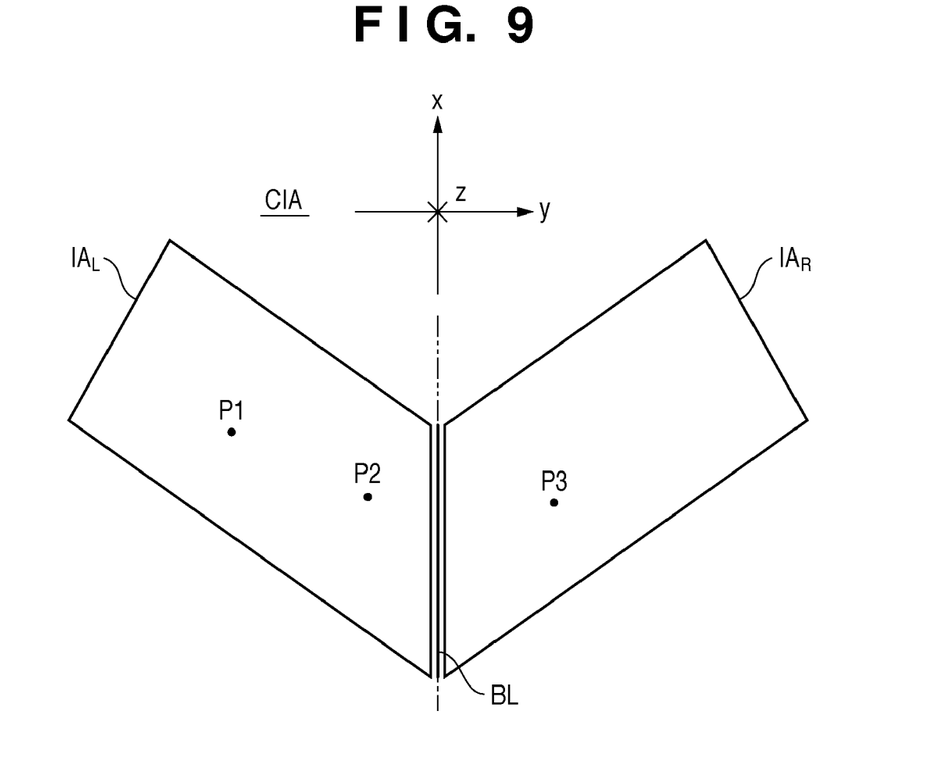
FIG. 9 is a diagram showing a V-shaped composite illumination region formed by the Dach mirror shown in FIG. 7.

The rectangular illumination regions $IA_L$ and $IA_R$ formed by the illumination systems 210A and 210B, respectively, are connected (composited) by the shaping action of the Dach mirror 220A to form a V-shaped composite illumination region CIA, as shown in FIG. 9. Note that although FIG. 9 shows the illumination regions $IA_L$ and $IA_R$ in a separate state for the sake of easy understanding of the composite illumination region CIA, they are precisely connected in practice. In other words, the illumination regions $IA_L$ and $IA_R$ are connected in one boundary line BL. For this reason, as long as the illumination systems 210A and 210B form illumination regions $IA_L$ and $IA_R$ having a uniform illuminance, in principle, a composite illumination region CIA formed by connecting (compositing) them has a uniform illuminance, including the boundary line BL. FIG. 9 is a diagram showing the V-shaped composite illumination region CIA formed by the Dach mirror 220A.

If the bonding portion between the mirrors 222A and 224A of the Dach mirror 220A has fractures or chippings, illumination nonuniformity often occurs in the composite illumination region CIA. When this occurs, the illuminance nonuniformity can be adjusted (corrected) by the aberration of the imaging optical system 250. More specifically, it is only necessary to generate an astigmatism aberration in the imaging optical system 250. The astigmatism aberration can guide the light beam to diverge only in one direction by changing the focus state. Hence, as long as an astigmatism aberration which guides the light beam to diverge only in the y direction (an astigmatism aberration in a direction perpendicular to the boundary line BL) is generated in the imaging optical system 250 in FIG. 9, it is possible to adjust illuminance nonuniformity which occurs in the boundary line BL without guiding the light beam to diverge in a direction (x direction) perpendicular to the y direction. To generate an astigmatism aberration, a cylindrical lens, for example, may be used or the adjustment of only an astigmatism aberration in a direction perpendicular to the boundary line BL may be omitted in adjusting the imaging optical system 250.

Figure 10:
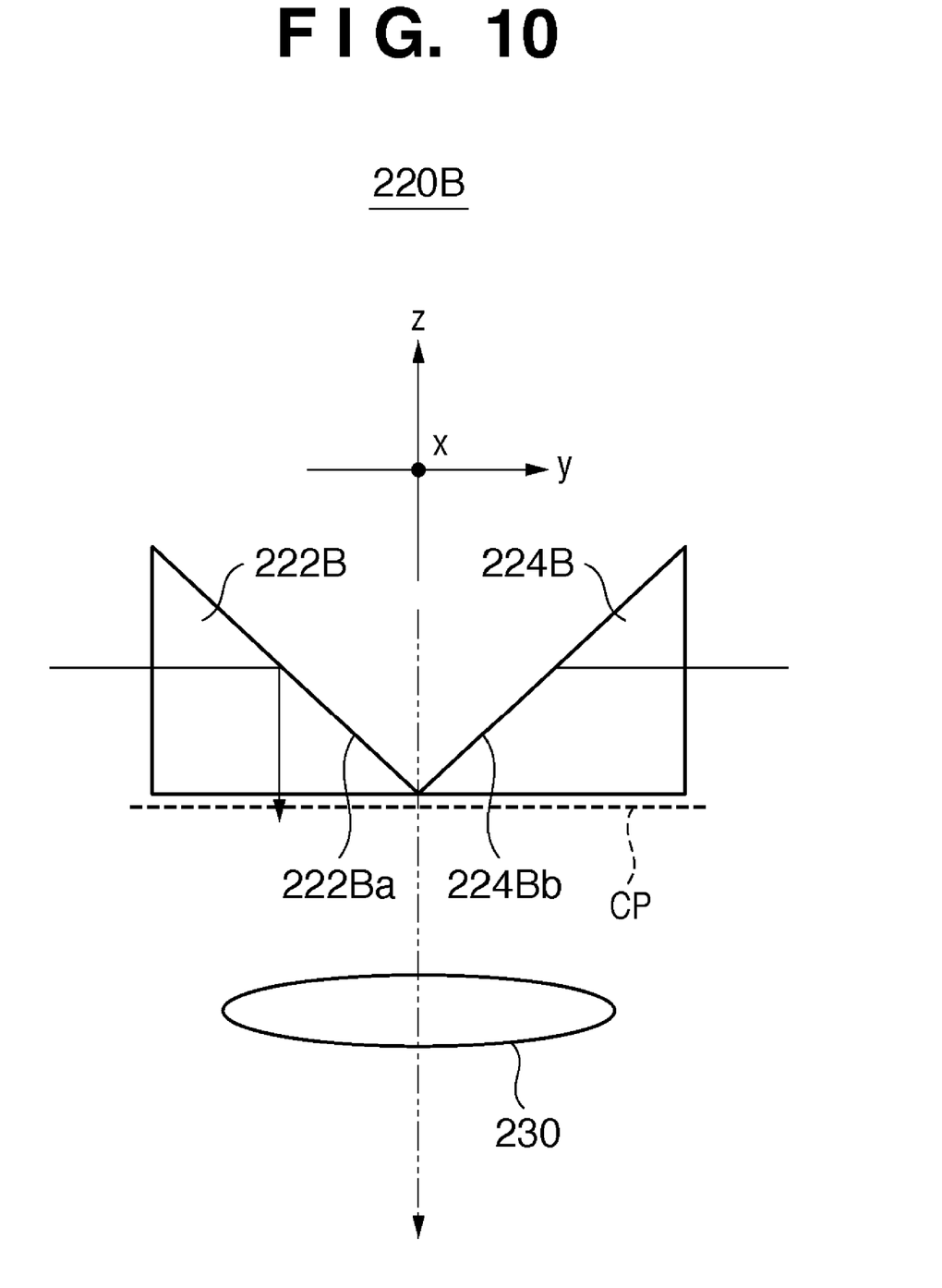
FIG. 10 is a view showing a Dach prism as an example of the optical member in the illumination optical system of the exposure apparatus shown in FIG. 1.

The optical member 220 may be a Dach prism 220B including two reflective prisms 222B and 224B having inner surfaces 222Ba and 224Ba, respectively, which form reflecting surfaces which reflect the incident light beams, as shown in FIG. 10. Each of the reflective prisms 222B and 224B can be, for example, a total reflection prism or an Amici prism. The two reflective prisms 222B and 224B are set such that the inner surfaces 222Ba and 224Ba are orthogonal to each other and each form an angle of almost 45° with respect to the principal ray of the incident light beam. FIG. 10 is a view showing the Dach prism 220B as an example of the optical member 220.

In the Dach prism 220B, the light beam from the illumination system 210A converges on the illumination region compositing plane CP upon being totally reflected by the reflective prism 222B. Likewise, the light beam from the illumination system 210B converges on the illumination region compositing plane CP upon being totally reflected by the reflective prism 224B. In this manner, the Dach prism 220B exploits total reflection, so no optical coating is necessary unless the converging light components enter it at wide angles. This makes it possible to obtain a reflectance close to 100%. In addition, the Dach prism 220B has a merit of having a high collecting efficiency with respect to the illumination light because no optical coating is necessary, and, therefore, having a high resistance to problematic heat so that its deterioration is prevented. Needless to say, the Dach prism 220B may be coated with an optical coating and used.

Figure 11:
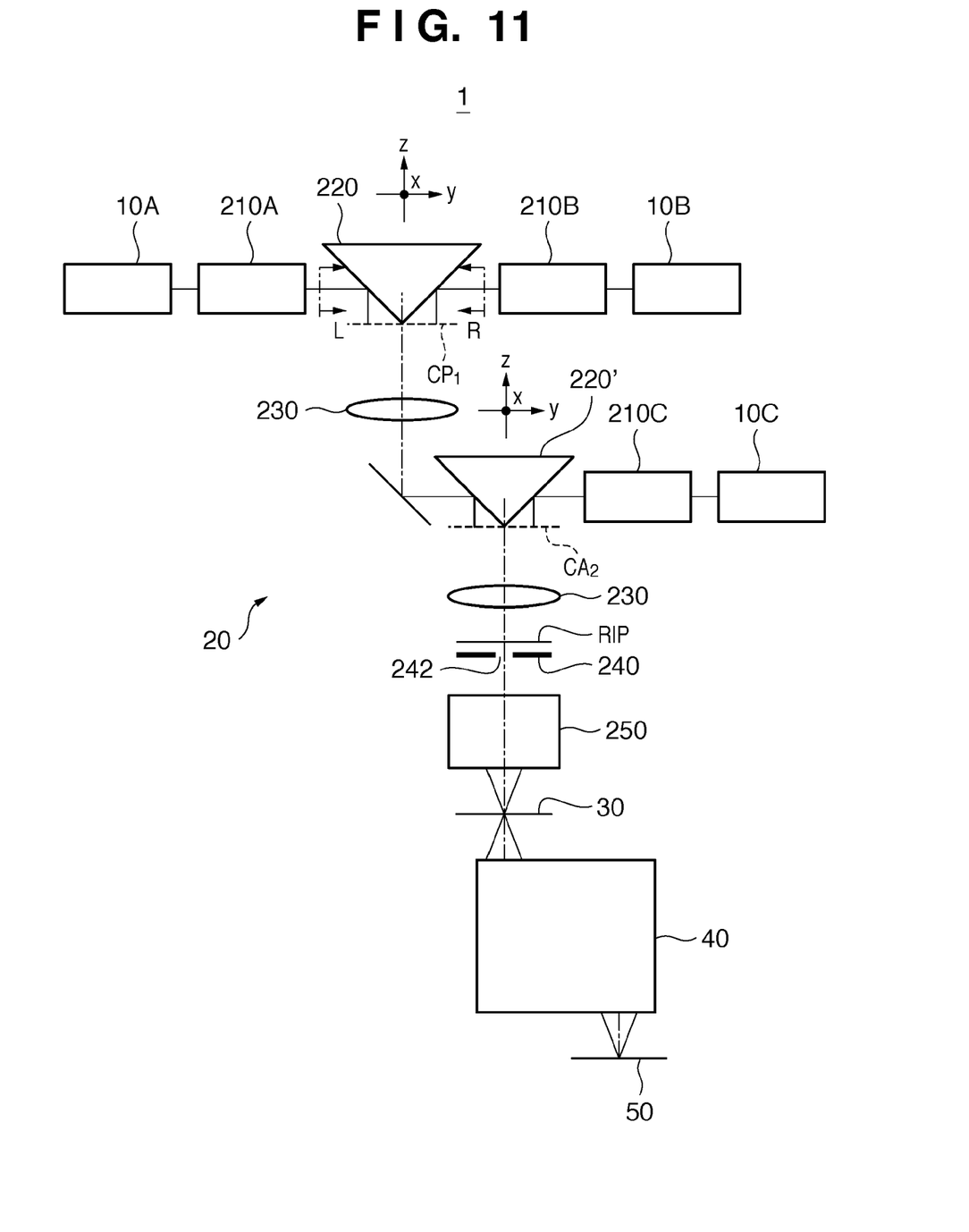
FIG. 11 is a schematic view showing the arrangement of an exposure apparatus according to another aspect of the present invention.

In FIG. 1, the illumination efficiency is improved by forming a V-shaped composite illumination region CIA by the two illumination systems 210A and 210B and one optical member 220, and extracting an arcuated illumination region $IA_F$ from it. However, a U-shaped composite illumination region CIA may be formed by three illumination systems 210A to 210C and two optical members 220 and 220', as shown in FIG. 11, and an arcuated illumination region $IA_F$ may be extracted from it. In this manner, the illumination efficiency can be further improved by forming a composite illumination region having a shape close to a required one (in this embodiment, a shape closer to an arcuated shape) by a plurality of illumination systems and a plurality of optical members. FIG. 11 is a schematic view showing the arrangement of an exposure apparatus 1 according to another aspect of the present invention.

Figure 12:
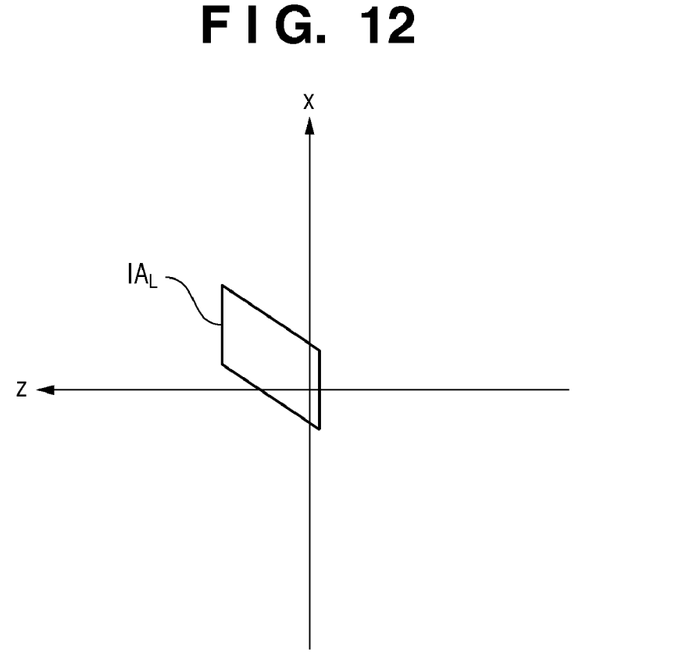
FIG. 12 is a diagram showing a rectangular illumination region (along the x-z section) formed by an illumination system in an illumination optical system of the exposure apparatus shown in FIG. 11.
Figure 13:
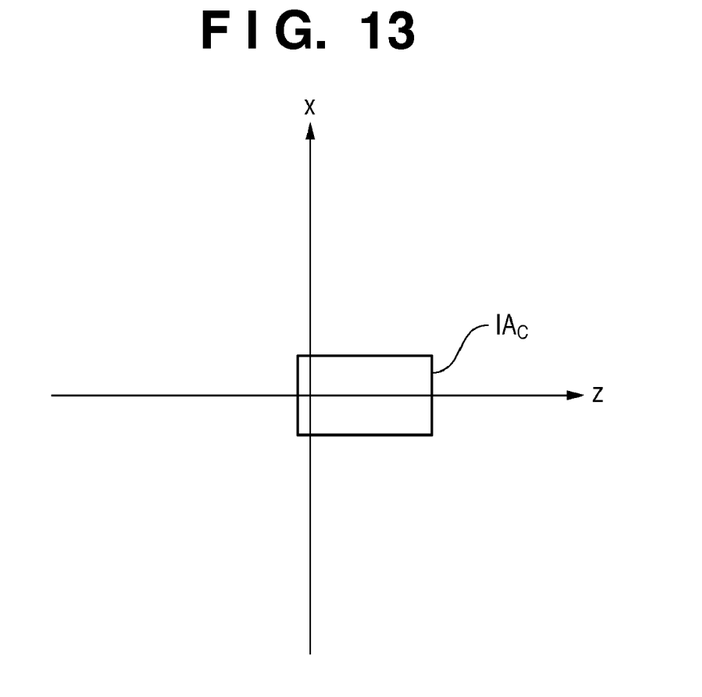
FIG. 13 is a diagram showing a rectangular illumination region (along the x-z section) formed by an illumination system in the illumination optical system of the exposure apparatus shown in FIG. 11.
Figure 14:
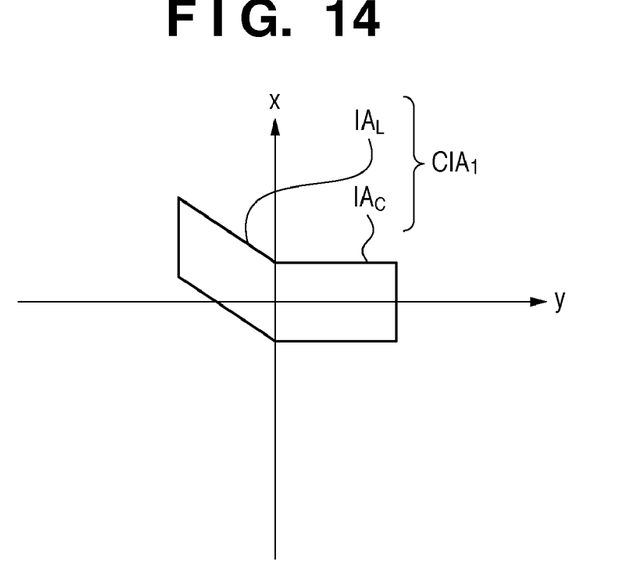
FIG. 14 is a diagram showing a first composite illumination region formed by an optical member in the illumination optical system of the exposure apparatus shown in FIG. 11.

Illumination regions formed by an illumination optical system 20 of the exposure apparatus 1 shown in FIG. 11 will be explained. FIG. 12 is a diagram showing a rectangular illumination region $IA_L$ (along the x-z section) formed by the illumination system 210A. FIG. 13 is a diagram showing a rectangular illumination region $IA_C$ (along the x-z section) formed by the illumination system 210B. The illumination regions $IA_L$ and $IA_C$ shown in FIGS. 12 and 13, respectively, are connected (composited) by the optical member 220. With this operation, a first composite illumination region $CIA_1$ as shown in FIG. 14 is formed on a first illumination region compositing plane $CP_1$. FIG. 14 is a diagram showing the first composite illumination region $CIA_1$ formed by the optical member 220.

Figure 15:
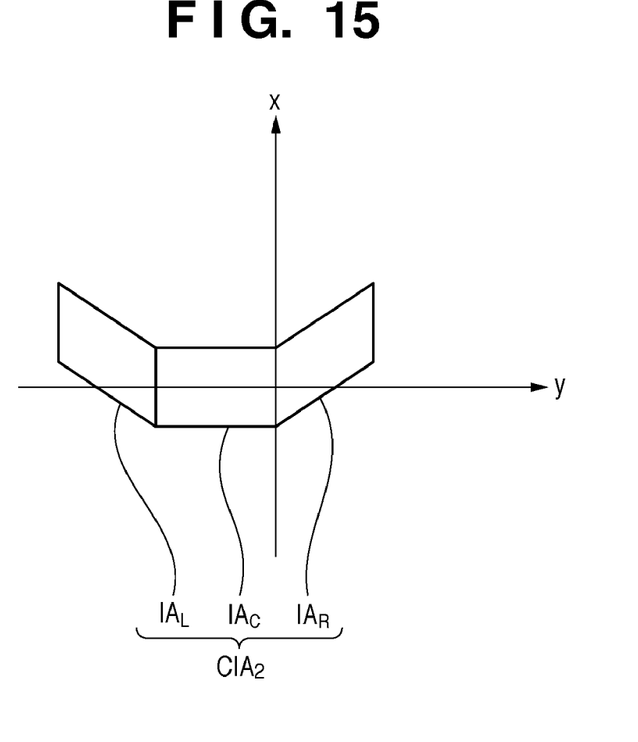
FIG. 15 is a diagram showing a second composite illumination region formed by an optical member in the illumination optical system of the exposure apparatus shown in FIG. 11.

The light in the first composite illumination region $CIA_1$ formed on the first illumination region compositing plane $CP_1$ forms an image on a second illumination region compositing plane $CP_2$ upon being reflected by the optical member 220' via a condenser system 230. Also, the optical member 220' reflects the light in a rectangular illumination region $IA_R$ (see FIG. 3) formed by the illumination system 210C to form an image of the light on the second illumination region compositing plane $CP_2$. Accordingly, the optical member 220' connects (composites) the first composite illumination region $CIA_1$ (illumination regions $IA_L$ and $IA_C$) and the rectangular illumination region $IA_R$ on the second illumination region compositing plane $CP_2$ to form a U-shaped second composite illumination region $CIA_2$, as shown in FIG. 15. Because the optical members 220 and 220' precisely (accurately) connect the illumination regions $IA_L$, $IA_C$, and $IA_R$, as mentioned above, they form a second composite illumination region $CIA_2$ having a uniform illuminance free from any illuminance nonuniformity in the connecting portions between the illumination regions $IA_L$, $IA_C$, and $IA_R$. Note that FIG. 15 is a diagram showing the second composite illumination region $CIA_2$ formed by the optical member 220'.

Figure 16:
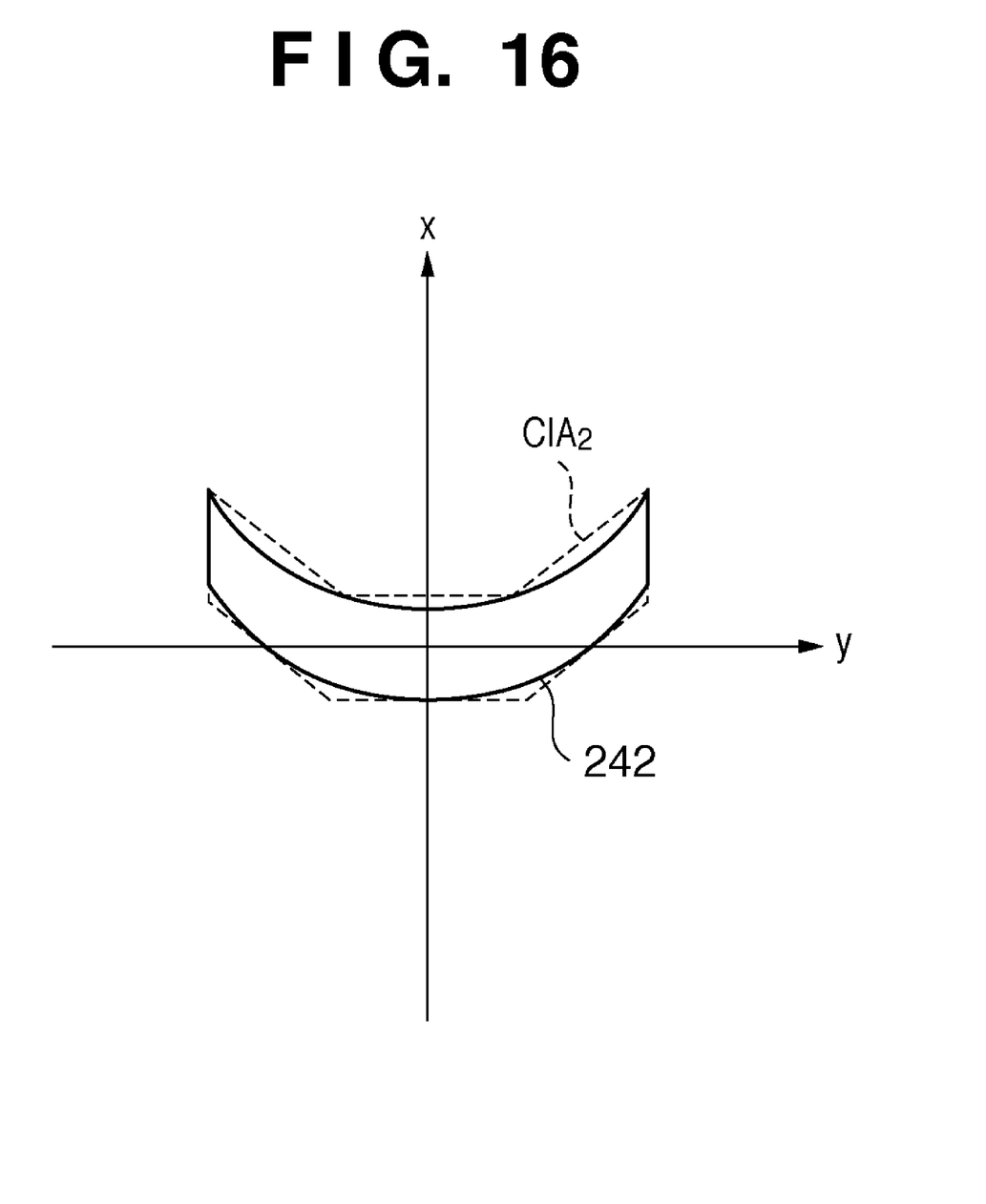
FIG. 16 is a diagram showing the relationship between the second composite illumination region shown in FIG. 15 and a light-shielding unit (opening).

The U-shaped second composite illumination region $CIA_2$ formed on the second illumination region compositing plane $CP_2$ is reproduced (formed) on a re-imaging plane RIP as well via the condenser system 230, but is partially extracted by (an opening 242 of) a light-shielding unit 240, as shown in FIG. 16. Accordingly, an arcuated illumination region corresponding to the opening 242 of the light-shielding unit 240 is formed on a reticle 30 via an imaging optical system 250. FIG. 16 is a diagram showing the relationship between the second composite illumination region $CIA_2$ and the light-shielding unit 240 (opening 242).

Figure 17:
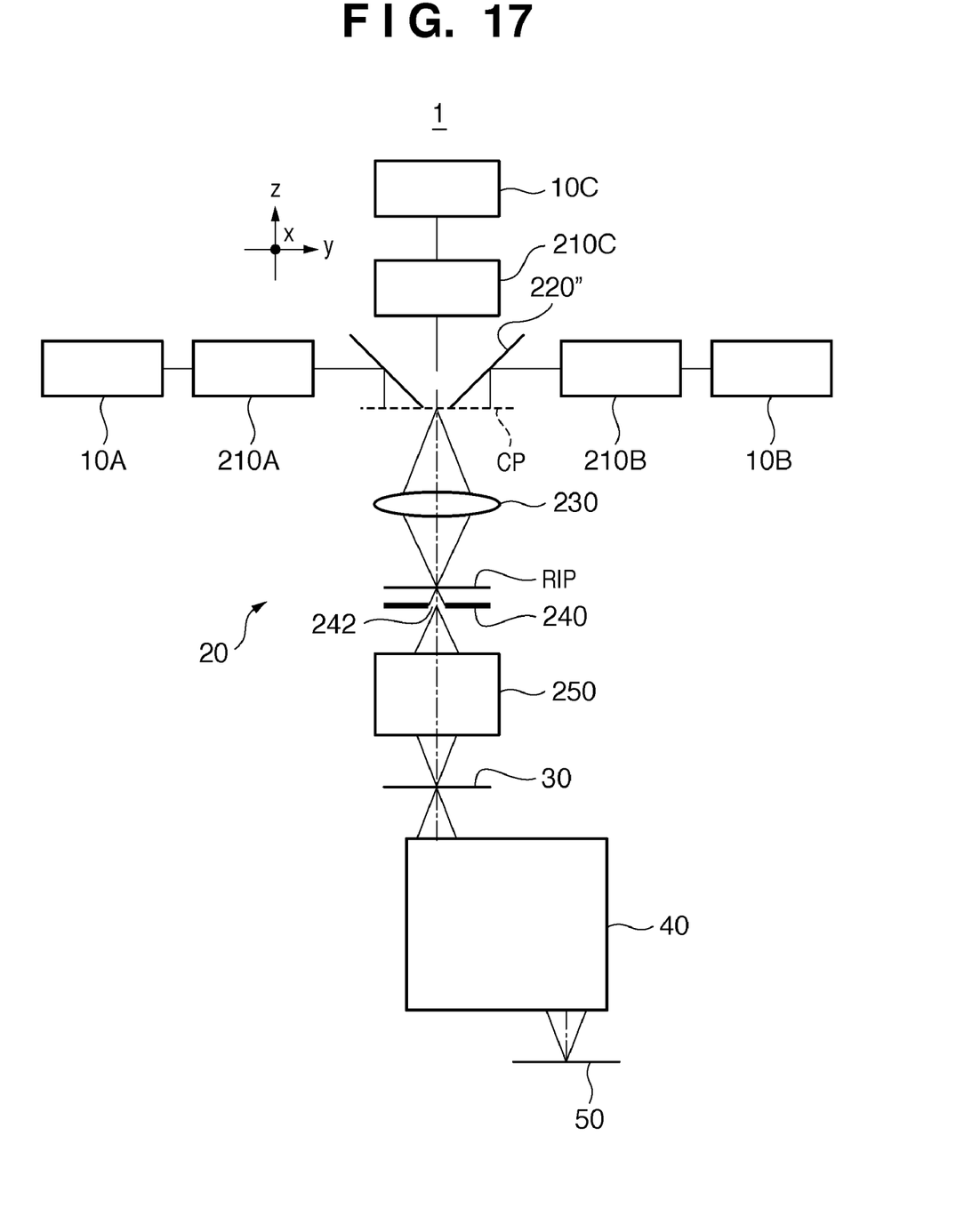
FIG. 17 is a schematic view showing the arrangement of an exposure apparatus according to still another aspect of the present invention.

In FIG. 11, the three rectangular illumination regions $IA_L$, $IA_C$, and $IA_R$ formed by the illumination systems 210A to 210C are connected (composited) using the two optical members 220 and 220'. However, as shown in FIG. 17, illumination regions $IA_L$, $IA_C$, and $IA_R$ can be connected (composited) using one optical member 220'' configured such that three reflecting surfaces which reflect the light beams from illumination systems 210A to 210C are orthogonal to each other. This makes it possible to remarkably simplify the arrangement of the illumination optical system 20 and to obtain high illumination efficiency. FIG. 17 is a schematic view showing the arrangement of an exposure apparatus 1 according to still another aspect of the present invention.

Referring back to FIG. 1, the reticle 30 has a circuit pattern and is supported and driven by the reticle stage (not shown). Diffracted light generated by the reticle 30 is projected onto the wafer 50 via the projection optical system 40. Since the exposure apparatus 1 is a scanner, it transfers the pattern of the reticle 30 onto the wafer 50 by scanning them.

The projection optical system 40 projects the pattern of the reticle 30 onto the wafer 50. The projection optical system 40 can be a dioptric system, catadioptric system, or catoptric system.

The wafer 50 is a substrate onto which the pattern of the reticle 30 is projected (transferred), and is supported and driven by the wafer stage (not shown). However, a glass plate or another substrate can be used in place of the wafer 50. The wafer 50 is coated with a resist.

In exposure, light emitted by the light sources 11A and 10B illuminates the reticle 30 by the illumination optical system 20. The light which bears the information of the pattern of the reticle 30 forms an image on the wafer 50 by the projection optical system 40. The illumination optical system 20 used in the exposure apparatus 1 can form an illumination region having a uniform illuminance (for example, a rectangular illumination region) while suppressing a decrease in the illumination efficiency, as mentioned above. Hence, the exposure apparatus 1 can provide high-quality devices (for example, a semiconductor device, an LCD device, an image sensing element (such as a CCD), and a thin-film magnetic head) with a high throughput and a good economical efficiency.

A method of fabricating a device (for example, a semiconductor IC device or liquid crystal display device) using the exposure apparatus 1 will be explained next. A device is fabricated by a step of exposing a substrate (for example, a wafer or glass substrate) coated with a photosensitive agent, using the exposure apparatus 1, a step of developing the substrate (photosensitive agent), and other known steps. The device fabrication method can fabricate devices with higher qualities than those fabricated by the prior arts. In this manner, the device fabrication method using the exposure apparatus 1 and the resultant device constitute one aspect of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-048825, filed Feb. 28, 2008, which is hereby incorporated by reference herein in its entirety.

What is claimed is:

1. An illumination optical system which illuminates a surface to be illuminated with light from a light source, the illumination optical system comprising:
   a plurality of illumination systems configured to form predetermined illumination regions with the light from the light source;
   an optical system having reflecting surfaces, which are configured to reflect the light beams from said illumination systems, respectively for said plurality of illumination systems; and
   a light-shielding unit configured to shield a certain light component in a composite illumination region formed by the light from said optical system to shape a shape of the composite illumination region,
   wherein the light beams from said plurality of illumination systems are reflected by said reflecting surfaces, illuminate different positions on an opening of said light-shielding unit, and one continuous composite illumination region is formed by connecting the respective illumination regions, and
   wherein the surface to be illuminated is illuminated with the light beam which has passed through said light-shielding unit.

2. The illumination optical system according to claim 1, wherein said optical system includes a Dach mirror configured such that adjacent reflecting surfaces of said plurality of reflecting surfaces are perpendicular to each other.

3. The illumination optical system according to claim 1, wherein
   said optical system includes two reflective prisms each having an inner surface configured to form one reflecting surface of said plurality of reflecting surfaces, and
   said two reflective prisms are set such that said inner surfaces thereof are perpendicular to each other and each form an angle of substantially 45° with respect to a principal ray of the incident light beam.

4. The illumination optical system according to claim 1, wherein the composite illumination region has a V shape or a U shape.

5. The illumination optical system according to claim 4, wherein said light-shielding unit has an arcuated opening inscribed in the composite illumination region having the V shape or the U shape.

6. The illumination optical system according to claim 1, further comprising an imaging optical system configured to form an image of the light beam, which has passed through said light-shielding unit, on the surface to be illuminated.

7. The illumination optical system according to claim 6, wherein said imaging optical system has an astigmatism aberration in a direction perpendicular to a boundary line obtained by connecting illumination regions of the light beams which come from said plurality of illumination systems and enter different positions the composite illumination region.

8. The illumination optical system according to claim 1, wherein each of said plurality of illumination systems includes an optical integrator.

9. A scanning exposure apparatus which transfers a pattern of a reticle onto a substrate while scanning the reticle and the substrate, the apparatus comprising:
   an illumination optical system defined in claim 1, which is configured to illuminate the reticle set on a surface to be illuminated with light from a light source; and
   a projection optical system configured to project an image of the pattern of the reticle onto the substrate.

10. A device fabrication method comprising the steps of:
   exposing a substrate using an exposure apparatus; and
   developing the exposed substrate,
   wherein said exposure apparatus includes:
   an illumination optical system configured to illuminate the reticle set on a surface to be illuminated with light from a light source; and
   a projection optical system configured to project an image of the pattern of the reticle onto the substrate,
   wherein said illumination optical system includes:
   a plurality of illumination systems configured to form predetermined illumination regions with the light from the light source;
   an optical system having reflecting surfaces, which are configured to reflect the light beams from said illumination systems, respectively for said plurality of illumination systems; and
   a light-shielding unit configured to shield a certain light component in a composite illumination region formed by the light from said optical system to shape a shape of the composite illumination region,
   wherein the light beams from said plurality of illumination systems are reflected by said reflecting surfaces, illuminate different positions on an opening of said light-shielding unit, and one continuous composite illumination region is formed by connecting the respective illumination regions, and
   wherein the reticle is illuminated with the light beam which has passed through said light-shielding unit.

* * * * *